(12) United States Patent
Standing

(10) Patent No.: US 7,045,884 B2
(45) Date of Patent: May 16, 2006

(54) SEMICONDUCTOR DEVICE PACKAGE

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/677,069

(22) Filed: Oct. 1, 2003

(65) Prior Publication Data

US 2004/0119148 A1    Jun. 24, 2004

Related U.S. Application Data

(60) Provisional application No. 60/416,503, filed on Oct. 4, 2002, provisional application No. 60/417,217, filed on Oct. 8, 2002, provisional application No. 60/446,758, filed on Feb. 11, 2003.

(51) Int. Cl.
H01L 23/02    (2006.01)

(52) U.S. Cl. .................. 257/678; 257/724; 257/725; 257/726

(58) Field of Classification Search ............... 257/738, 257/734, 686, 777, 433, 724–728, 678
See application file for complete search history.

(56) References Cited

U.S. PATENT DOCUMENTS

| | | | | |
|---|---|---|---|---|
| 5,198,685 A | * | 3/1993 | Kitani et al. | 257/82 |
| 5,426,263 A | * | 6/1995 | Potter et al. | 174/52.4 |
| 6,137,165 A | * | 10/2000 | Thierry | 257/690 |
| 6,392,290 B1 | * | 5/2002 | Kasem et al. | 257/678 |
| 6,529,380 B1 | * | 3/2003 | Kono | 361/708 |
| 2004/0061163 A1 | * | 4/2004 | Nakayama | 257/302 |
| 2004/0061221 A1 | * | 4/2004 | Schaffer | 257/723 |
| 2004/0222528 A1 | * | 11/2004 | Kunikiyo | 257/758 |
| 2004/0245519 A1 | * | 12/2004 | Van De Walle et al. | 257/40 |
| 2005/0082668 A1 | * | 4/2005 | Murohara | 257/734 |
| 2005/0121784 A1 | * | 6/2005 | Standing | 257/737 |

* cited by examiner

Primary Examiner—Hoai Pham
Assistant Examiner—Nathan W. Ha
(74) Attorney, Agent, or Firm—Ostrolenk, Faber, Gerb & Soffen, LLP

(57) ABSTRACT

A semiconductor package that includes two circuit boards and at least one semiconductor device which is disposed between the two circuit boards and connected to external connectors disposed on at least one of the circuit boards.

20 Claims, 9 Drawing Sheets

SEMICONDUCTOR DEVICE PACKAGE

RELATED APPLICATIONS

The application is based on and claims benefit of U.S. Provisional Application No. 60/416,503, filed on Oct. 4, 2002, entitled Multiple Phase Inverter Modules for High Density Power Applications, U.S. Provisional Application No. 60/417,217, filed on Oct. 8, 2002, entitled Multiple Phase Inverter Modules For High Density High Power Applications and U.S. Provisional Application No. 60/446,758, filed Feb. 11, 2003, entitled Intelligent Multiphase Modules, to which claims of priority are hereby made.

BACKGROUND OF THE INVENTION

To integrate a semiconductor component into an electronic circuit, the component must be packaged. FIG. 1 shows the cross-section of a typical, multi-chip package 5, which includes substrate 6, semiconductor components 7, and molded housing 8. It should be noted that semiconductor components are interconnected inside the package and to external connectors (not shown) by connectors such as bond wires 9A and in some cases conductive clips, e.g. 9B.

Such connectors add to the overall resistance and inductance of the package, and cause undesirable effects such as ringing.

Furthermore, if the package contains heat generating components, in a conventional package such as package 5, a heatsink (not shown) may be thermally coupled to substrate 6 to dissipate the generated heat. The size of the heatsink typically depends on the amount of heat generated. Thus, a large amount of heat would require a larger heatsink. Therefore, heat generation has a bearing on the size of the package.

SUMMARY OF THE INVENTION

It is an object of the present invention to provide a package for a semiconductor device or a plurality of semiconductor devices.

A semiconductor package according to the present invention includes a first circuit board, a second circuit board, and at least one semiconductor device disposed between the two circuit boards. In the preferred embodiment of the present invention the circuit boards are the thermally conductive variety such as insulated metal substrate or double bonded copper. When thermally conductive circuit boards are used double-sided cooling may be achieved. As a result, heat dissipation may be divided between two surfaces and instead of one large heatsink for dissipating heat from one surface, which is the prior art solution, two smaller heatsinks may be used, thereby reducing the overall size of the package.

According to one aspect of the invention, at least one of the circuit boards includes external connectors for external connection to other components. Each electrical connector is a portion of a conductive track on the circuit board which also includes at least one conductive pad that is electrically connected to an electrical contact of the at least one semiconductor device.

According to another embodiment of the present invention, a semiconductor package may include a plurality of semiconductor devices which are interconnected inside the package to form one a or a plurality of circuits. For example, a package according to the present invention may include a plurality of power switching devices for forming half-bridges or converter circuits.

It has been determined, through experiments, that a semiconductor die in a package according to the present invention exhibits 26% less thermal resistance at its electrical contacts than a die in a conventional package. It has also been found that a die in a package according to the present invention operates at a lower temperature than a die in a conventional package. Experiments have shown, for example, that under identical load conditions the steady state temperatures measured at the outer surface of a circuit board in a package according to the present invention is 75° C. while the temperature at a similar position for a conventional package is 82° C.

Other features and advantages of the present invention will become apparent from the following description of the invention which refers to the accompanying drawings.

DETAILED DESCRIPTION OF THE FIGURES

Figure 1:
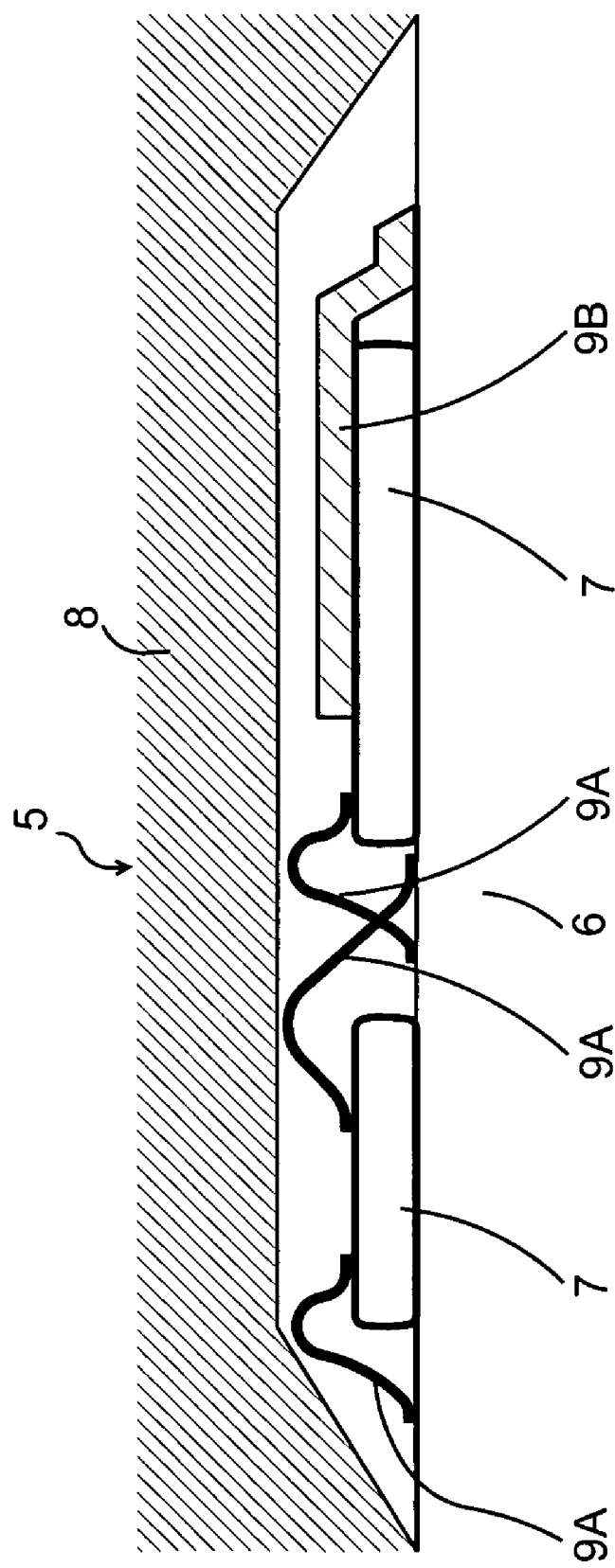
FIG. 1 shows a cross-sectional view of a semiconductor package according to the prior art.
Figure 2:
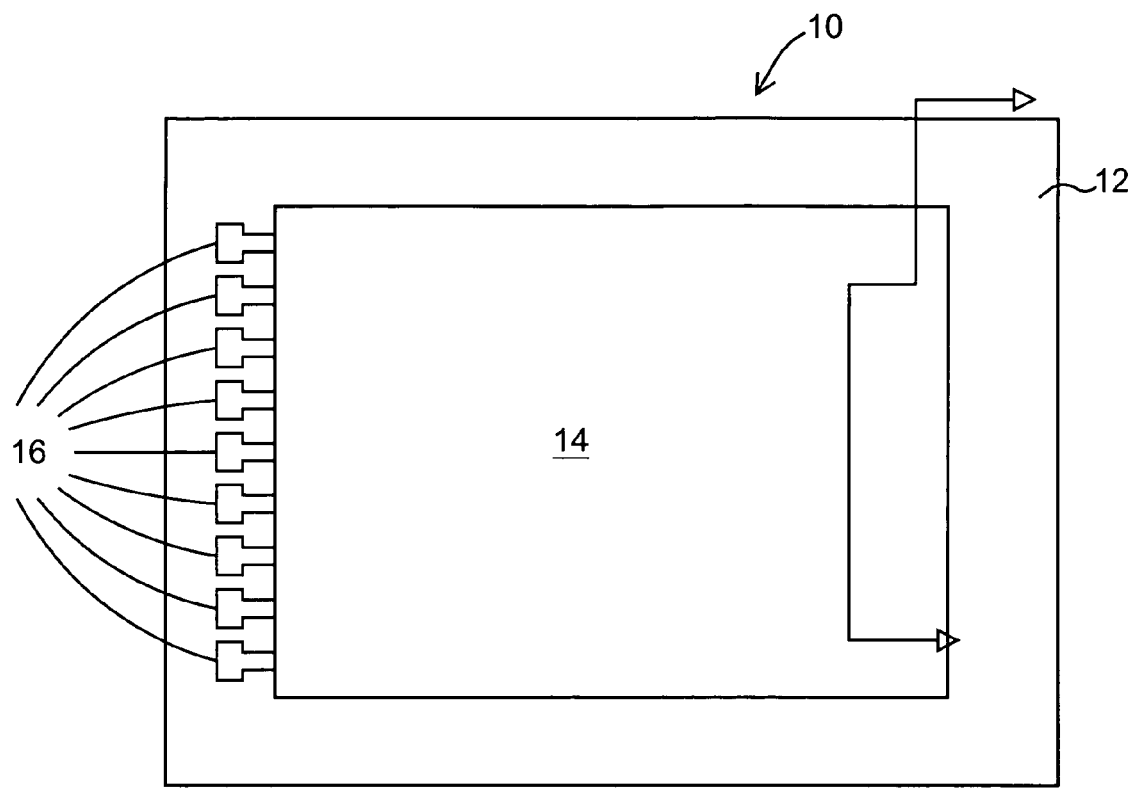
FIG. 2 shows the top plan view of a semiconductor package according to the first embodiment of the present invention.

Referring to FIG. 2, semiconductor package 10 according to the first embodiment of the present invention includes first circuit board 12, and second circuit board 14 which is assembled over first circuit board 12. According to an aspect of the present invention, circuit boards 12, 14 are of the thermally conductive variety such as insulated metal substrate (IMS), or double-bonded copper (DBC). Such circuit boards include a thermally conductive, but electrically insulating body which can have conductive patterns formed over at least one of its surfaces. In the first embodiment of the present invention, first circuit board 12 includes a plurality of external connectors 16 which serve as input and output connectors to the elements disposed between first circuit board 12 and second circuit board 14 as will be described later.

Figure 3:
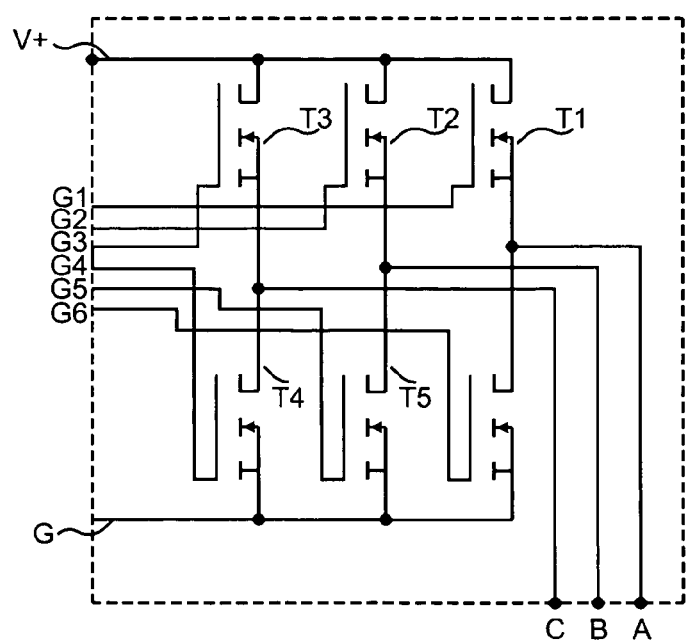
FIG. 3 shows the circuit diagram for the components disposed within a package according to the first embodiment of the present invention.

Referring next to FIG. 3, semiconductor package 10 according to the first embodiment of the present invention includes a plurality of power MOSFETs $T_1$, $T_2$, $T_3$, $T_4$, $T_5$, $T_6$ which are interconnected to form three parallel-connected half-bridge circuits, each for driving a respective phase of a three-phase motor.

As is well known in the art, each half-bridge circuit includes a high side MOSFET, $T_3$, $T_2$, $T_1$ and a low side MOSFET $T_4$, $T_5$, $T_6$. When power MOSFETs are used to form half-bridge circuits, the source contact of the high side MOSFET, e.g. $T_1$, is series connected to the drain contact of the low side MOSFET e.g. $T_6$, while the drain contact of the high side MOSFET is connected to the input power $V_+$ and the source contact of the low side MOSFET is connected to the ground G. Referring to FIG. 3, in the first embodiment of the present invention MOSFET $T_3$, forms a half-bridge with MOSFET $T_4$, MOSFET $T_2$ forms a half-bridge with MOSFET $T_5$, and MOSFET $T_1$ forms a half-bridge with MOSFET $T_6$. As is well known the output of each half-bridge circuit A, B, C is taken from the connection point of its high side MOSFET to its respective low side MOSFET as shown by FIG. 3. To operate each MOSFET $T_1$, $T_2$, $T_3$, $T_4$, $T_5$, $T_6$, a gate signal is sent by a control circuit (not shown) through a respective gate connection $G_1$, $G_2$, $G_3$, $G_4$, $G_5$, $G_6$. It should be understood that the present invention is not restricted to the circuit shown by FIG. 3, and that other circuits formed with other devices may be packaged according to the principles of the present invention.

Figure 4:
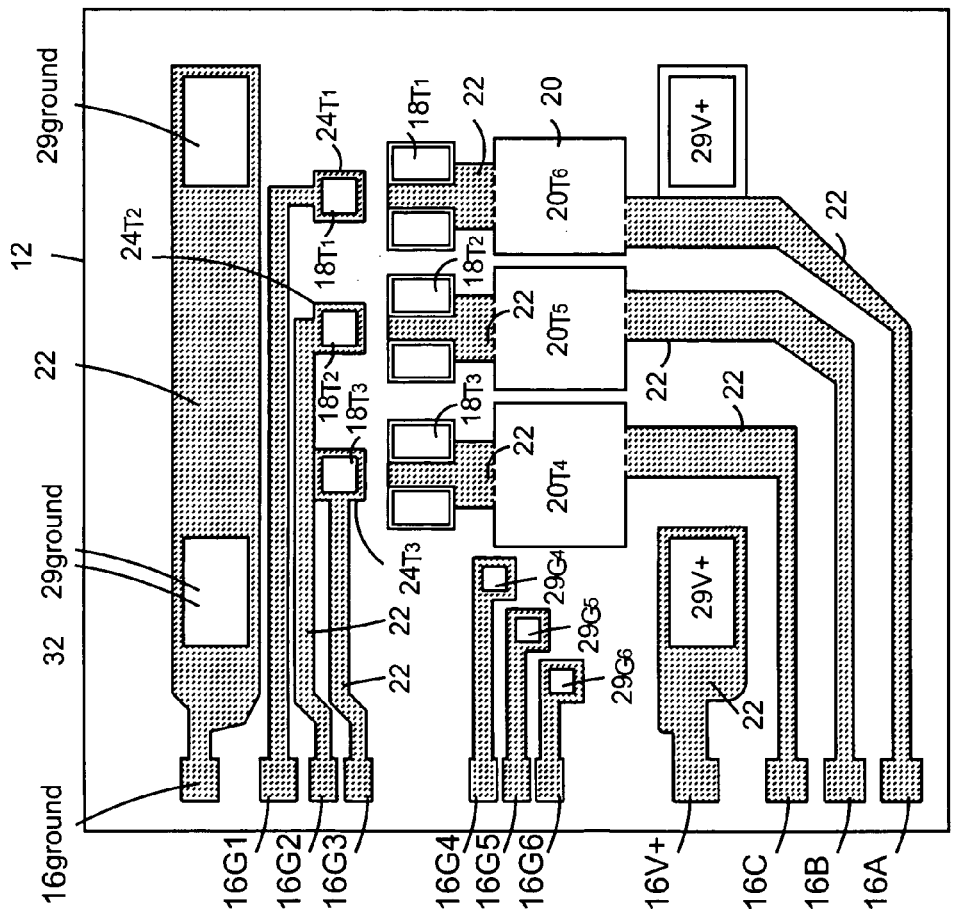
FIG. 4 shows a top plan view of a circuit board used in a package according to the present invention.

According to an aspect of the present invention a circuit, such as the one shown by FIG. 3, is implemented without the use of wirebonds or the like. Specifically, referring now to FIG. 4, first circuit board 12 includes a plurality of source conductive pads $18_{T1}$, $18_{T2}$, $18_{T3}$ for receiving source contacts of high side MOSFETS $T_1$, $T_2$, $T_3$, respectively, and drain conductive pads $20_{T6}$, $20_{T5}$, $20_{T4}$ for receiving the drain contacts of low side MOSFETs $T_6$, $T_5$, $T_4$, respectively. Each conductive pad is an area on a conductive track which has been exposed through an opening in a solder passivation layer formed on the conductive track. The conductive track is itself disposed on the thermally conductive body of a circuit board 12, 14. Specifically, each conductive track is a layer of conductive material, such as copper or aluminum, which is patterned to a desired configuration. Conductive tracks are covered with solder passivation material, and openings are formed in the solder passivation material to expose portions of the conductive tracks to serve as conductive pads.

Source conductive pad $18_{T1}$ is connected electrically through a conductive trace 22 on circuit board 12 to conductive pad $20_{T6}$, and then connected to external connector $16_A$ through another conductive trace 22 on circuit board 12. Each conductive trace 22 is essentially a portion of the conductive track which electrically connects conductive pads together or to an external connection. Specifically, for example, as will be shown, source conductive pad $18_{T1}$, drain conductive pad $20_{T2}$, and traces 22, and external connector $16_A$ form a conductive track that provides an output connection for the half-bridge circuit that is formed by MOSFETs $T_1$ and $T_6$.

Now continuing with the description of the first embodiment, conductive pads $18_{T2}$, and $18_{T3}$ are similarly connected to conductive pads $20_{T5}$ and $20_{T4}$ and then to external connectors $16_B$ and $16_C$ in a similar manner. As a result, source contacts of high side MOSFETs $T_1$, $T_2$, $T_3$ are electrically connected to drain contacts of respective low side MOSFETs $T_6$, $T_5$, $T_4$ and then connected to external connectors $16_A$, $16_B$, $16_C$, which serve as output connections for each half-bridge circuit without using any wirebonds.

First circuit board 12 also includes gate conductive pads $24_{T1}$, $24_{T2}$, $24_{T3}$ each for receiving a respective gate contact of high side MOSFETs $T_1$, $T_2$, $T_3$. Gate conductive pad $24_{T1}$ is connected via a trace 22 to external connector $16_{G1}$, which serves as the gate connection for receiving a gate signal for high side MOSFET $T_1$. Similarly, gate pads $24_{T2}$ and $24_{T3}$ are connected to output connectors $16_{G2}$ and $16_{G3}$ respectively via traces 22. Connectors $16_{G2}$, $16_{G3}$ serve as gate connections for high side MOSFETs $T_2$, $T_3$.

Figure 5:
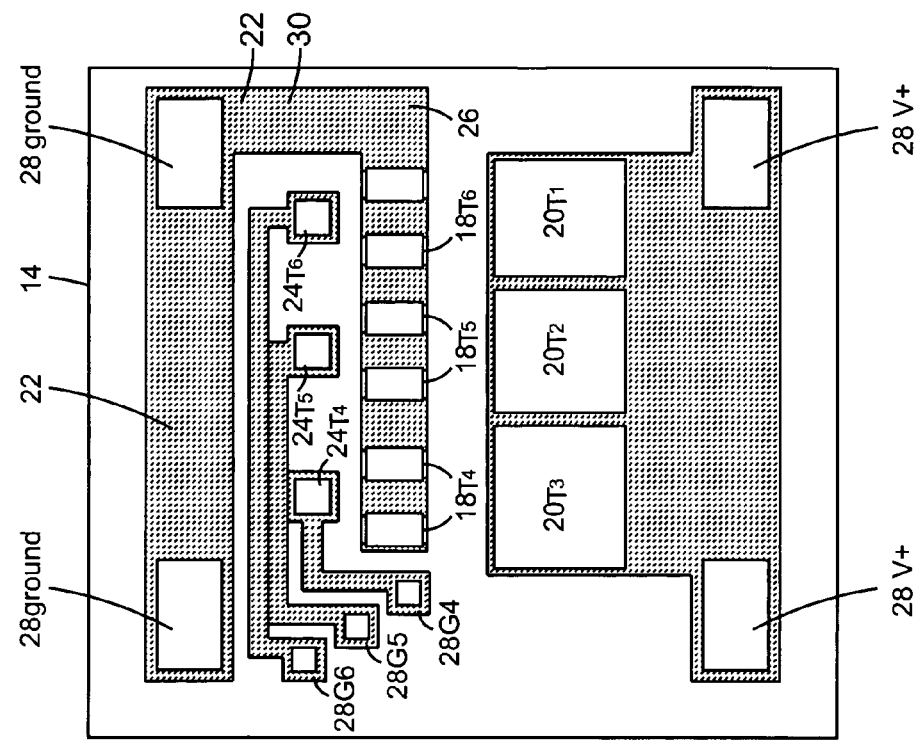
FIG. 5 shows a top plan view of another circuit board used in a package according to the present invention.

Referring now to FIG. 5, second circuit board 14 includes drain conductive pads $20_{T1}$, $20_{T2}$, $20_{T3}$ for receiving drain contacts of high side MOSFETs $T_1$, $T_2$, $T_3$. Second circuit board 14 also includes interconnect conductive pads $28_{V+}$ and $28_{Vground}$. Drain conductive pads $20_{T1}$, $20_{T2}$, $20_{T3}$ are formed on the same conductive trace as interconnect conductive pads $28_{V+}$. Interconnect pads $28_{V+}$ are electrically connectable to interconnect pad $29_{V+}$ on first circuit board 12, which is electrically connected to external connector $16_{V+}$ via a trace 22. As a result drain contacts of high side MOSFET $T_1$, $T_2$, $T_3$ will be connected electrically to external connector $16_{V+}$. External connector $16_{V+}$ in the first embodiment of the present invention serves as the connection to the input power $V_+$, when second circuit board 14 is disposed over first circuit board 12.

Second circuit board 14 also includes gate conductive pads $24_{T4}$, $24_{T5}$, $24_{T6}$ for receiving gate contacts of low side MOSFETs $T_4$, $T_5$, $T_6$. Each gate conductive pad $24_{T4}$, $24_{T5}$, $24_{T6}$ is electrically connected to gate interconnect pads $28_{G4}$, $28_{G5}$, $28_{G6}$ via a respective trace 22. Each gate interconnect pad $28_{G4}$, $28_{G5}$, $28_{G6}$ is then connected to a corresponding gate interconnect pad $29_{G4}$, $29_{G5}$, $29_{G6}$ on first circuit board 12, and thereby electrically connected via a respective trace 22 to a corresponding gate connector $16_{G4}$, $16_{G5}$, $16_{G6}$.

Also disposed on second circuit board 14 are source conductive pads $18_{T4}$, $18_{T5}$, $18_{T6}$, and ground interconnect pads $28_{ground}$. Source conductive pads $18_{T4}$, $18_{T5}$, $18_{T6}$ and ground interconnect pads $28_{ground}$ are formed on a common conductive track and, therefore, are electrically connected together. Ground interconnect pads $28_{ground}$ on second circuit board 14 are connected to corresponding ground interconnect pads $29_{ground}$ on first circuit board 12, which are in turn connected via a common trace 32 to external ground connector $16_{ground}$. As a result, source contacts of low side MOSFETs $T_4$, $T_5$, $T_6$ are connectable to a ground connection via external connector $16_{ground}$.

Figure 6:
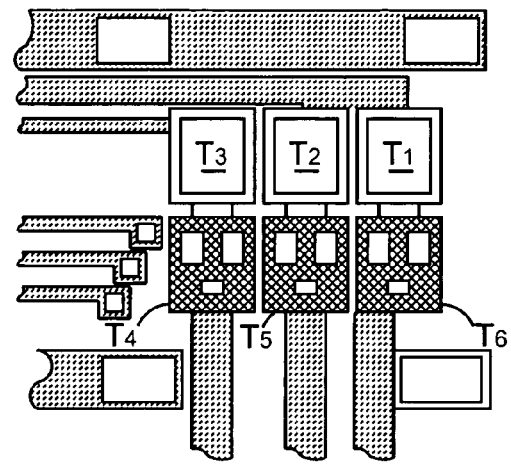
FIG. 6 shows a top plan view of the circuit board shown by FIG. 4 which includes a plurality of semiconductor switching devices.
Figure 7:
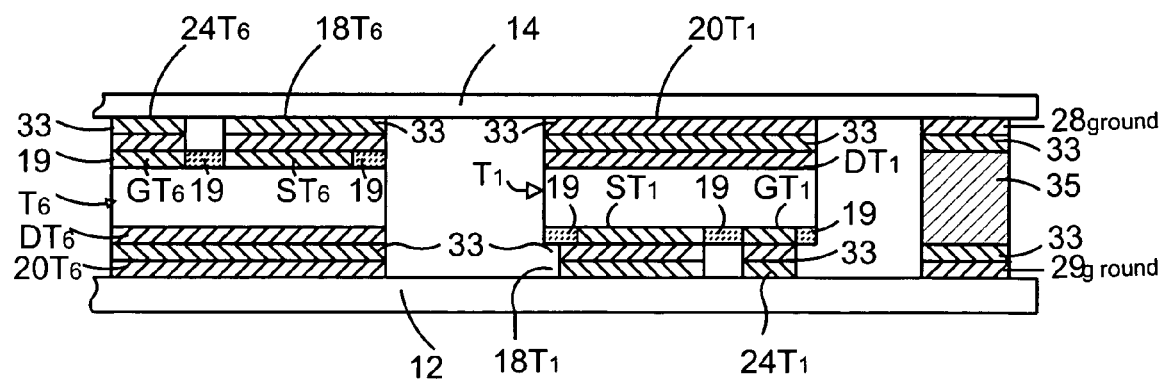
FIG. 7 shows a cross-sectional view of a package according to the present invention taken along line 7—7 in FIG. 2 viewed in the direction of the arrows.

Referring now to FIGS. 6 and 7, source contact, e.g. $ST_1$, of each high side MOSFET $T_1$, $T_2$, $T_3$ is electrically connected to a corresponding source conductive pad $18_{T1}$, $18_{T2}$, $18_{T3}$, and each gate contact, e.g. $GT_1$, of each high side MOSFET $T_1$, $T_2$, $T_3$ is electrically connected to a corresponding gate conductive pad $24_{T1}$, $24_{T2}$, $24_{T3}$. Also, each drain contact, e.g. $DT_6$, of each low side MOSFET $T_4$, $T_5$, $T_6$ is electrically connected to its corresponding drain conductive pad, e.g. $20_{T6}$, on first circuit board 12. Electrical connection in each case is made by a layer of conductive adhesive 33 such as solder or conductive epoxy. It should be noted that source contact and the gate contact of each MOSFET are exposed through a solder passivation 19 (shown by crossing lines in FIG. 6) layer which prevents the solder (or any other conductive adhesive) from shorting the gate contact to the source contact.

Referring now specifically to FIG. 7, second circuit board 14 is assembled opposite first circuit board 12 such that drain contact, e.g. $DT_1$ of each high side MOSFET $T_1$, $T_2$, $T_3$ is electrically connected via a layer of conductive adhesive 33 to its corresponding drain conductive pad, e.g. $20_{T1}$, on second circuit board 14. Similarly, source contact, e.g. $ST_6$, of each low side MOSFET $T_4$, $T_5$, $T_6$ is electrically connected via a layer of conductive adhesive 33 to its corresponding source conductive pad, e.g. $18T_6$ on second circuit board 14, and gate contact, e.g. $GT_6$, of each low side MOSFET, $T_4$, $T_5$, $T_6$, is electrically connected to its corresponding gate conductive pad, e.g. $24_{T6}$, via a layer of conductive adhesive 33.

Also shown in FIG. 7, is interconnect 35 which electrically connects ground conductive pad $29_{ground}$ on first circuit board 12 to ground conductive pad $28_{ground}$ on second circuit board 14. Interconnect 35 is connected to each conductive pad via a layer of conductive adhesive 33. Interconnect 35 may be any conductive body such as a copper slug.

FIG. 7 shows that low side MOSFET $T_6$, high side MOSFET $T_1$ and interconnect 35 are connected between first circuit board 12 and second circuit board 14. The remaining high side MOSFETs $T_2$, $T_3$ and low side MOSFETs $T_4$, $T_5$ are connected in the same manner as that of high side MOSFET $T_1$ and low side MOSFET $T_6$. Furthermore, interconnects are used to connect internal gate conductive pads $28_{G4}$, $28_{G5}$, $28_{G6}$ to internal conductive pads $29_{G4}$, $29_{G5}$, $29_{G6}$, and internal conductive pads $28_{V+}$ to conductive pads $29_{V+}$ in the same manner as described for interconnect 35 above.

Figure 8:
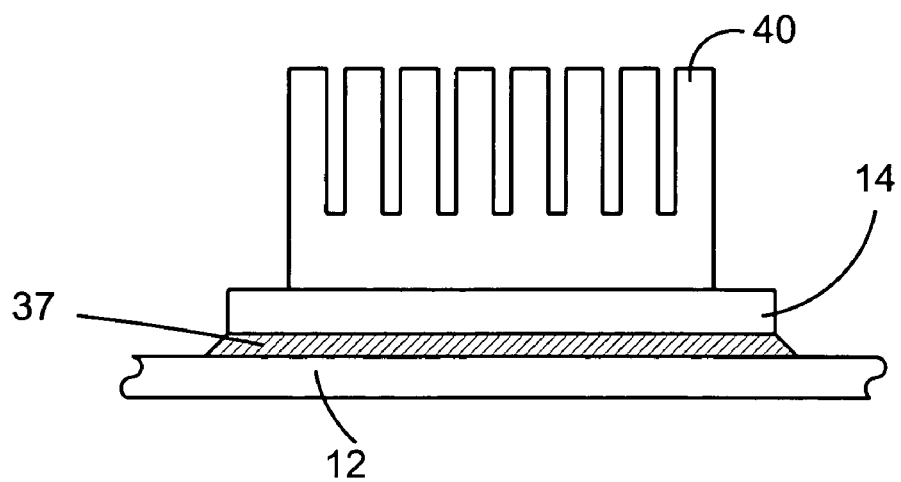
FIG. 8 shows a side view of a package according to the present invention which has a heatsink mounted on one side thereof.

Referring now to FIG. 8, once second circuit board 14 is assembled over first circuit board 12, an epoxy underfilling 37 is provided in the spaces between first circuit board 12 and second circuit board 14. The purpose of epoxy underfilling 37 is to protect MOSFETs from environmental conditions such as moisture. As shown by FIG. 8, a heatsink 40 may be thermally coupled to second circuit board 14 to assist in heat dissipation. Heatsink 40 may also be coupled to first circuit board 12 without deviating from the present invention According to an aspect of the present invention, each circuit board 12, 14 may receive a heatsink to effect double-sided cooling. Advantageously, because of double-sided cooling, smaller heatsinks can be used (instead of one large heatsink) thereby reducing the overall size of the package.

Figure 9A:
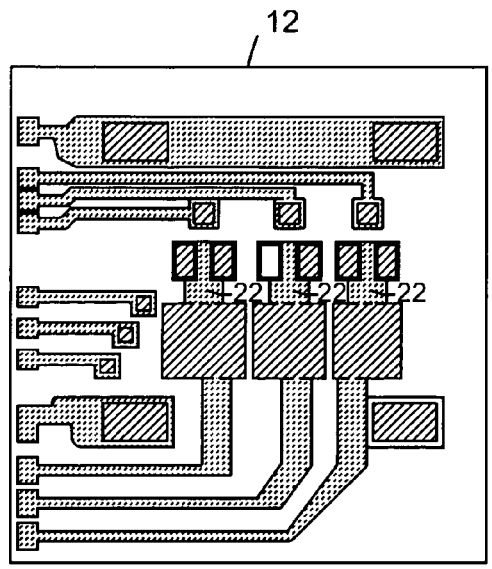
FIGS. 9A–9B illustrate the processing steps taken for the manufacture of a package according to the present invention.
Figure 9B:
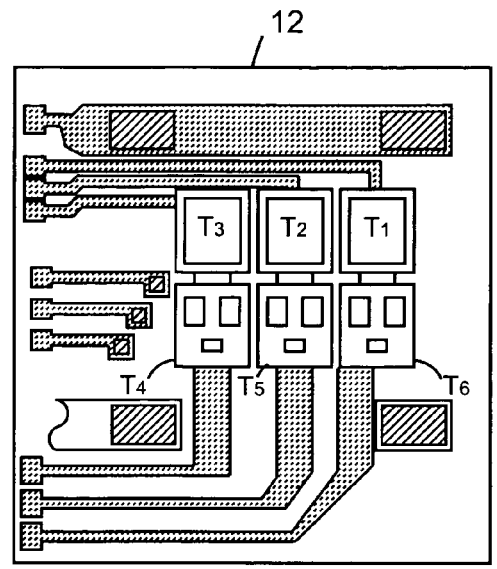
Figure 9C:
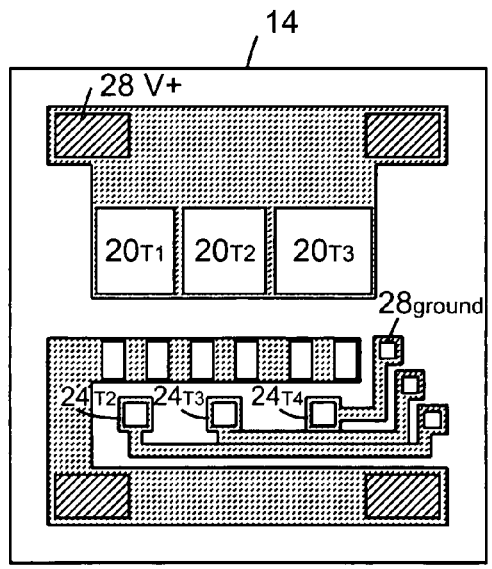
Figure 9D:
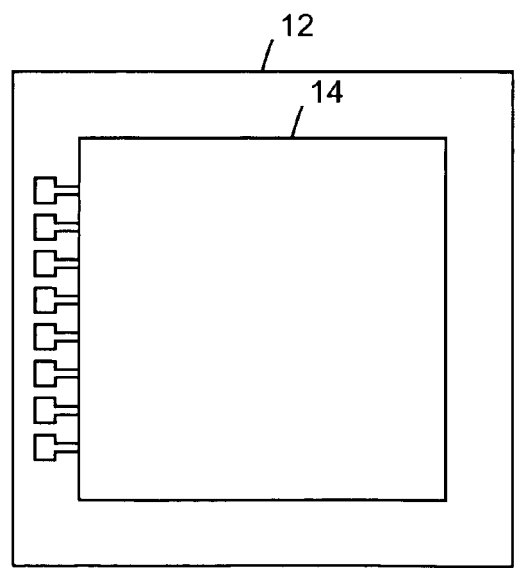

Referring now to FIGS. 9A–9D, semiconductor package 10 according to the present invention is manufactured according to the following process. First, solder paste (shown by slanted lines) or some other conductive adhesive is printed on the conductive pads on first circuit board 12. Next, as illustrated by FIG. 9B, high side MOSFETs $T_1$, $T_2$, $T_3$ and low side MOSFETs $T_4$, $T_5$, $T_6$ are placed on their respective positions on first circuit board 12. Thereafter, as illustrated by FIG. 9C, solder paste (shown by slanted lines) or some other conductive adhesive is printed on the conductive pads on second circuit board 14, and, as shown by FIG. 9D, second circuit board 14 is placed over first circuit and then the entire structure is heated to cause the solder paste to be reflown. Thereafter, epoxy is disposed to fill the space between first circuit board 12 and second circuit board 14.

According to the preferred embodiment of the present invention, a plurality of first circuit boards 12 may be linked together to form a large panel and MOSFETs $T_1$, $T_2$, $T_3$, $T_4$, $T_5$, $T_6$ and second circuit boards 14 may be placed by a pick-and-place machine. Then, first circuit boards 12 are cut from the large panel to form individual packages after epoxy underfilling has been applied.

Figure 10:
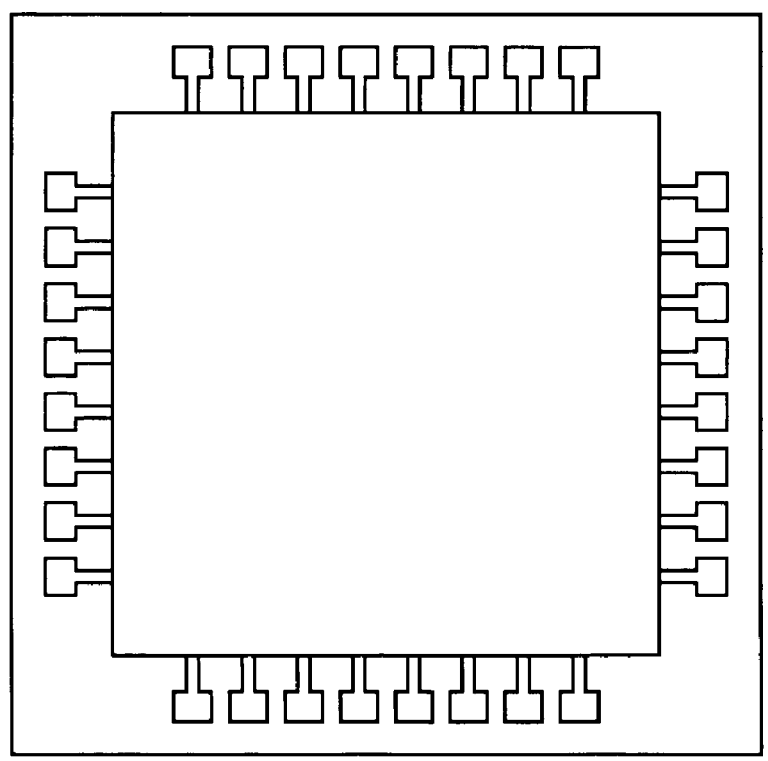
FIG. 10 shows a top plan view of a package according to the second embodiment of the present invention.

Referring now to FIG. 10, a package according to a second embodiment of the present invention may include external connectors on more than one side.

Figure 11:
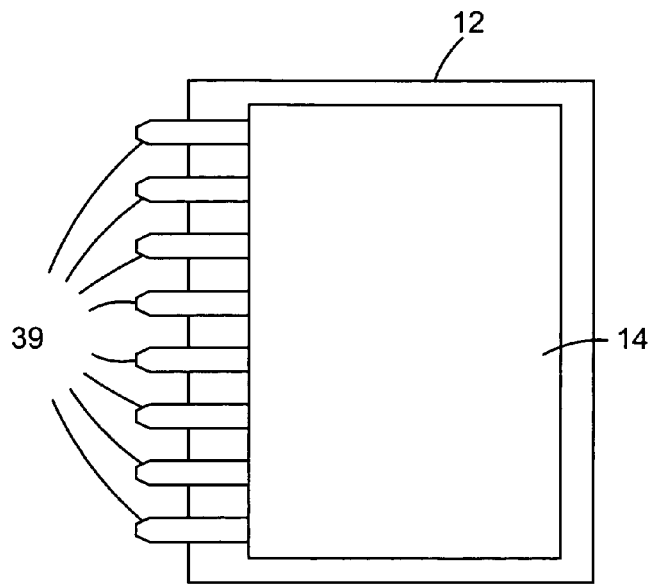
FIG. 11 shows a top plan view of a package according to the third embodiment of the present invention.
Figure 12:
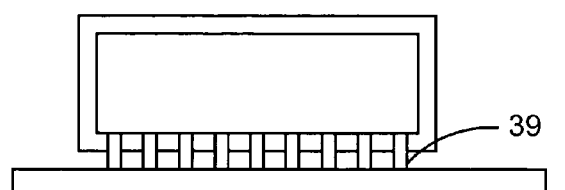
FIG. 12 shows a package according to the third embodiment of the present invention as integrated with a circuit board.

Referring to FIG. 11, a package according to the third embodiment of the present invention may include plug-type external connectors 39, which are adapted to be received in corresponding sockets, for example, in another circuit board. An example of such arrangement is shown by FIG. 12, in which a package according to the third embodiment of the present invention is shown assembled onto circuit board 42 having sockets (not shown) for receiving external conductors 39.

Figure 13:
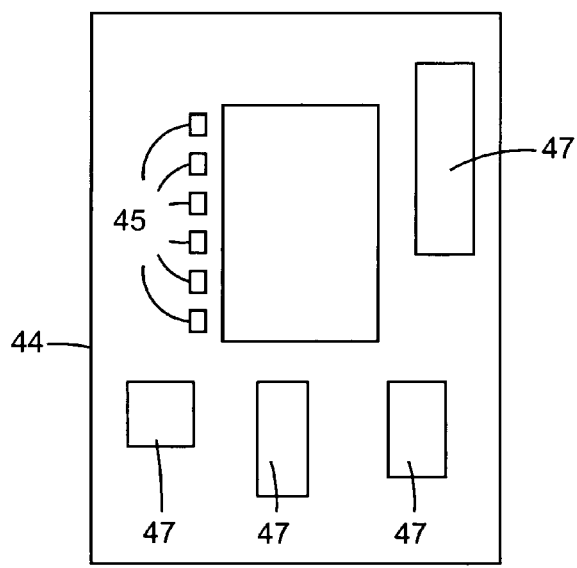
FIG. 13 shows a top plan view of a circuit board adapted for integration with a package according to the first embodiment of the present invention.
Figure 14:
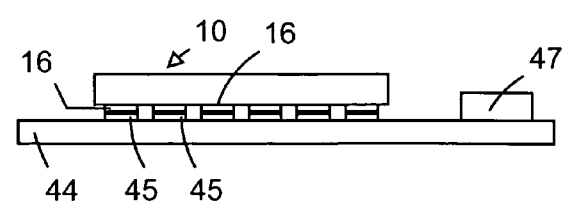
FIG. 14 shows a side view of a circuit board as integrated with a package according to the first embodiment of the present invention.

Referring now to FIG. 13, a package according to the first embodiment of the present invention may be integrated with another circuit board by having external connectors 16 electrically connected to corresponding lands. Specifically, FIG. 13 shows circuit board 44 having a plurality of conductive lands 45 for receiving external connectors 16 of a package according to the first embodiment of the present invention. FIG. 14 illustrates the assembly of package 10 according to the present invention onto circuit board 44. Circuit board 44 may include other components 47, which may be operatively connected to the components within package 10. Components 47, may be, for example, circuit elements for controlling the MOSFETs in package 10.

Figure 15:
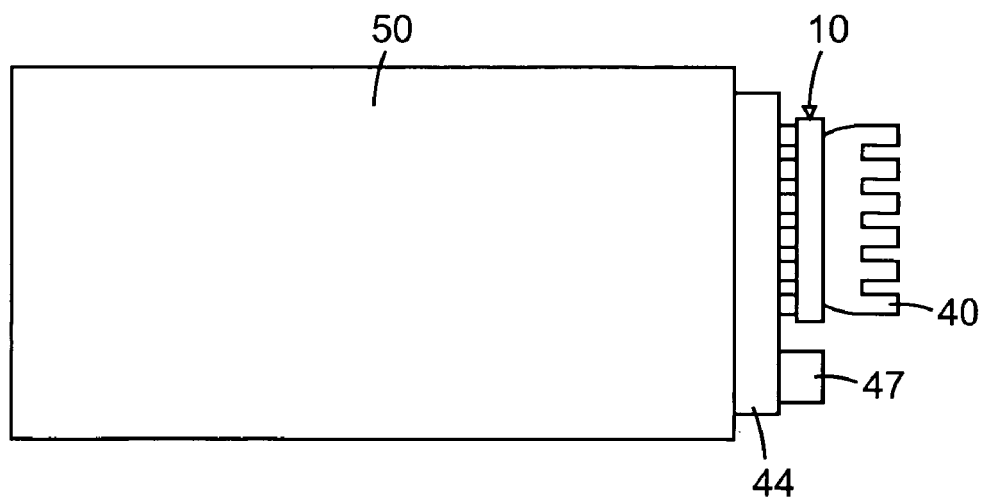
FIG. 15 shows a side view of a motor integrated with a circuit board that includes an integral package according to the present invention.

Referring to FIG. 15, according to an aspect of the present invention, a circuit board including a package according to the present invention may be adapted for mounting, and mounted to the body of a device, thereby forming, for example, a device having an integral control mechanism. Specifically, for example, circuit board 44 containing package 10, which includes three-half bridge circuits, may include a control circuitry for driving each half-bridge circuit, and mounted on the body of a three-phase motor 50. Each phase of motor 50 may then be operatively connected to the output connectors of package 10, thereby forming a motor package with an integral drive circuitry.

Figure 16:
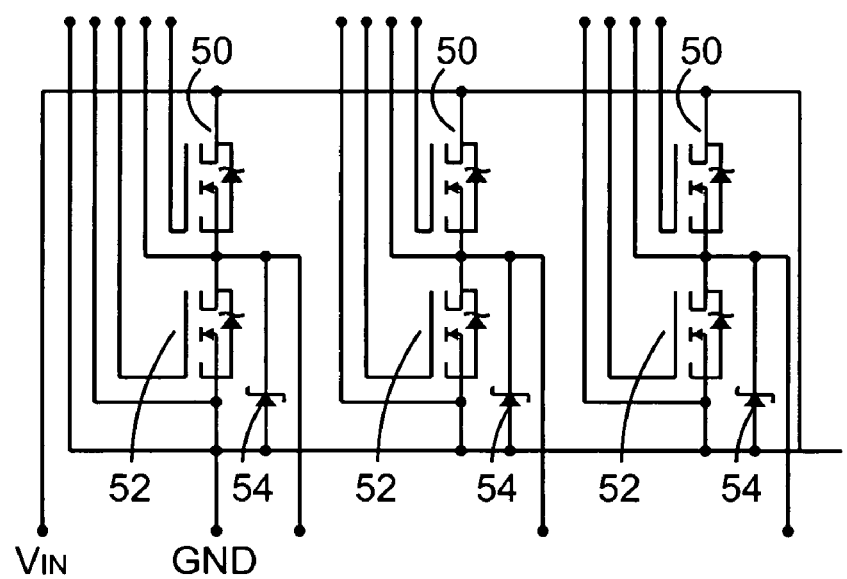
FIG. 16 shows a circuit diagram for a three-phase buck converter.
Figure 17:
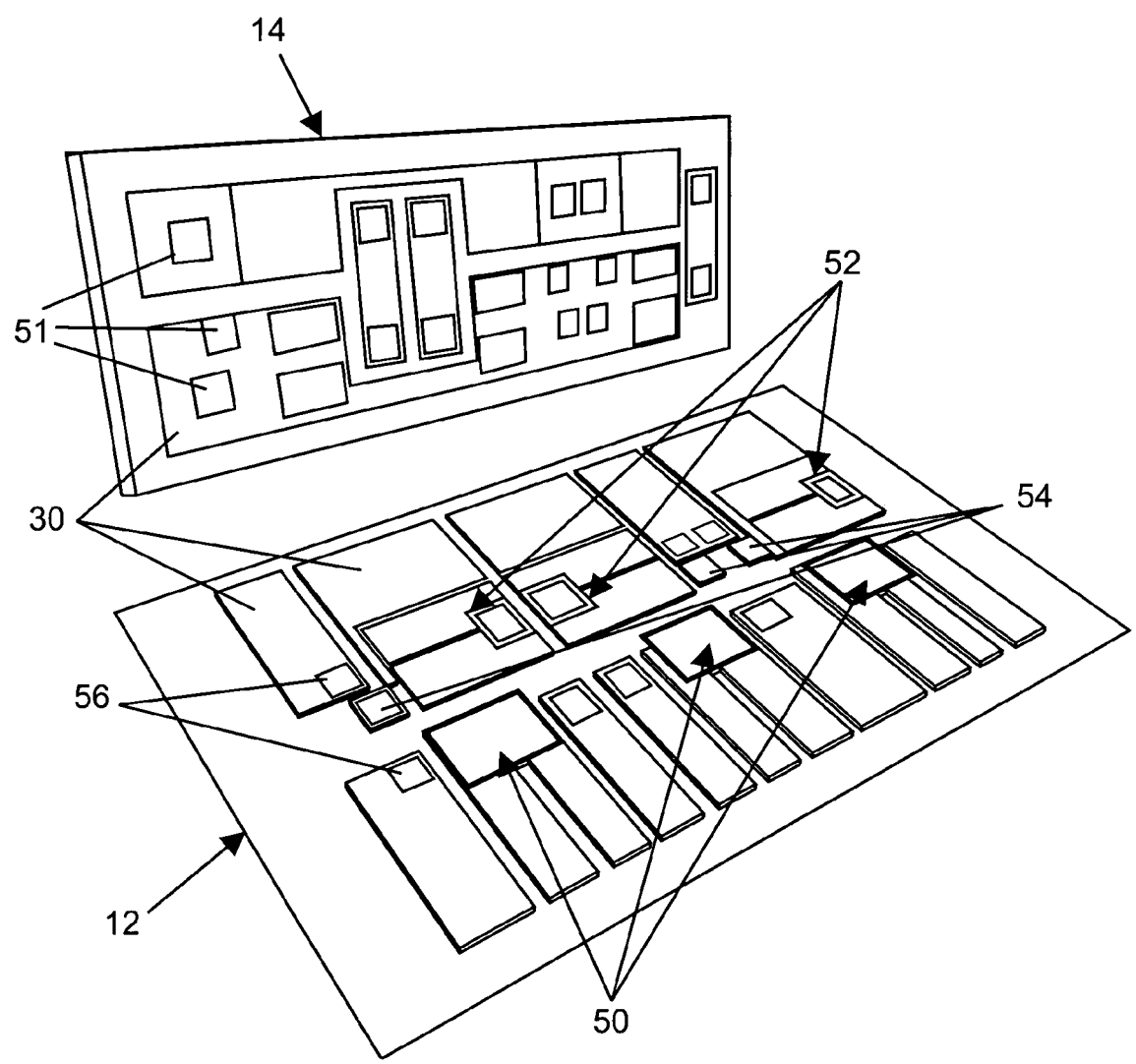
FIG. 17 illustrates a package according to the fourth embodiment of the present invention.

A package according to the present invention is not restricted to half-bridge circuits. Referring for example to FIGS. 16 and 17, a package according to the fourth embodiment of the present invention may be configured to include the power components for a three-phase synchronous buck converter as shown by FIG. 16. As is well known, a synchronous buck converter includes two series connected power switching elements, such as power MOSFETs, one of which is referred to as a control MOSFET 50, and the other as a synchronous MOSFET 52. Also, as is well known, a schottky diode 54 is connected between the source and the drain of the synchronous MOSFET 52. A three-phase synchronous buck converter is essentially three synchronous buck converters connected together.

Referring specifically to FIG. 17, a package according to the fourth embodiment includes first circuit board 12, second circuit board 14, control MOSFETs 50, synchronous MOSFETs 52, and schottky diodes 54. According to the present invention, circuit boards 12, 14 include conductive pads 51 formed on selected areas of conductive tracks 30 on each circuit board for electrical connections to, for example, electrical contacts of MOSFETs 50, 52, and schottky diodes 54, as well as conductive pads for receiving interconnects 56 for internal connection of the elements within the package. Similar to the first embodiment, a package according to the fourth embodiment may be manufactured by first placing the power components on first circuit board 12 as described earlier, printing solder paste (or some other conductive adhesive) on conductive pads of second circuit board 14, placing second circuit board 14 over first circuit board 12 and then reflowing the solder paste. Thereafter, the space between circuit boards 12, 14 may be filled with epoxy 37.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
    a first circuit board including at least one conductive pad disposed on a major surface thereof;
    a second circuit board including at least one conductive pad on a major surface thereof; and
    a semiconductor die including a first electrical contact on a first major surface thereof and a second electrical contact on a second major surface thereof;
    a first layer of conductive adhesive interposed between, and mechanically connected to, said first electrical contact and said at least one conductive pad on said first circuit board; and
    a second layer of conductive adhesive interposed between, and mechanically connected to, said second electrical contact and said at least one conductive pad on said second circuit board; whereby said first electrical contact is electrically connected to said at least one conductive pad on said first circuit board and said second electrical contact is electrically connected to said at least one conductive pad on said second circuit board.

2. A semiconductor package according to claim 1, further comprising terminals electrically connected to said first electrical contact and said second electrical contact of said semiconductor die, said terminals being disposed on at least one of said substrates.

3. A semiconductor package according to claim 1, wherein each of said circuit board is an insulated metal substrate.

4. A semiconductor package according to claim 1, wherein said semiconductor die is a switching power semiconductor device which includes a control terminal, said control terminal being disposed on one of said first major surface of said die and said second major surface of said die and electrically connected to a conductive pad on one of said circuit boards, and electrically connected to a terminal disposed on one of said circuit boards.

5. A semiconductor package according to claim 1, wherein said semiconductor die is one of a MOSFET and an IGBT.

6. A semiconductor package according to claim 1, wherein said conductive adhesive is either one of solder and conductive epoxy.

7. A semiconductor package according to claim 1, further comprising an epoxy underfilling disposed between said circuit boards.

8. A semiconductor package according to claim 1, further comprising a heatsink disposed on one of said circuit boards.

9. A semiconductor package according to claim 1, further comprising at least one heatsink disposed on each of said circuit boards.

10. A semiconductor package comprising:
    a first thermally conductive substrate including a plurality of conductive pads disposed on a first major surface thereof;
    a second thermally conductive substrate including a plurality of conductive pads disposed on a first major surface thereof;
    a plurality of power semiconductor devices each including a first power contact on a first major surface thereof, a second power contact and a control contact on a second opposing major surface thereof;
    a first layer of conductive adhesive interposed between, and mechanically connected to, a first power contact of each power semiconductor device and a respective conductive pad on said first thermally conductive substrate,
    a second layer of conductive adhesive interposed between, and mechanically connected to, a second power contact of each power semiconductor device and a respective conductive pad on said second thermally conductive substrate;
    and a third layer of conductive adhesive interposed between, and mechanically connected to, a control contact of each power semiconductor device and a respective conductive pad on said second thermally conductive substrate;
    whereby each one of said contacts of said power semiconductor devices is electrically connected to a respective one of said plurality of conductive pads, and wherein said conductive pads on said thermally conductive substrate are interconnected to form part of a circuit.

11. A semiconductor package according to claim 10, further comprising output terminals connected to said power semiconductor devices through said conductive pads and disposed on at least one of said substrates.

12. A semiconductor package according to claim 10, wherein said thermally conductive substrate are insulated metal substrates.

13. A semiconductor package according to claim 10, wherein said power semiconductor devices are one of power MOSFETs and IGBTs.

14. A semiconductor package according to claim 10, wherein said conductive adhesive is one of solder and conductive epoxy.

15. A semiconductor package according to claim 10, wherein said power semiconductor devices are connected in a half-bridge configuration.

16. A semiconductor package according to claim 10, wherein said power semiconductor device are connected to form a plurality of half-bridge configurations.

17. A semiconductor package according to claim 10, further comprising a control device for controlling the operation of said power semiconductor devices.

18. A semiconductor package according to claim 10, further comprising epoxy filling spaces between said first and second thermally conductive substrates.

19. A semiconductor package according to claim 10, further comprising at least one heatsink in thermal contact with one of said thermally conductive substrates.

20. A semiconductor package according to claim 10, further comprising a heatsink in thermal contact with each one of said conductive substrates.

* * * * *